United States Patent [19]

Simons

[11] 4,167,771

[45] Sep. 11, 1979

[54] THERMAL INTERFACE ADAPTER FOR A CONDUCTION COOLING MODULE

[75] Inventor: Robert E. Simons, Poughkeepsie, N.Y.

[73] Assignee: International Business Machines Corporation, Armonk, N.Y.

[21] Appl. No.: 807,096

[22] Filed: Jun. 16, 1977

[51] Int. Cl.² .................. H01L 23/34; F28F 13/14
[52] U.S. Cl. .................. 361/386; 165/80 A; 165/185; 174/16 HS; 357/81
[58] Field of Search ............. 165/80, 185, DIG. 7, 165/80 A–80 E; 174/16 HS; 361/382, 383, 384, 385, 386, 389

[56] References Cited

U.S. PATENT DOCUMENTS

| 3,062,507 | 11/1962 | Andrus | 165/185 |
| 3,128,419 | 4/1964 | Waldkotter et al. | 165/185 |
| 3,264,534 | 8/1966 | Murphy | 165/185 |
| 3,399,332 | 8/1968 | Savolainen | 357/81 |
| 3,629,549 | 12/1971 | Svendsen | 165/185 |
| 3,993,123 | 11/1976 | Chu et al. | 165/80 |

*Primary Examiner*—Sheldon Jay Richter
*Attorney, Agent, or Firm*—Harold H. Sweeney, Jr.

[57] ABSTRACT

A thermal interface adapter is provided which is located in the interface between the housing and the heat sink of a conduction cooling module of the type which provides a conduction heat transfer path for removing heat from electronic components. The thermal interface adapter creates an interface between the housing and the adapter, and the adapter and the heat sink. The thermal interface adapter and interfaces associated therewith have a predetermined thermal resistance thereby increasing the heat transfer path thermal resistance to allow the thermal components within the module to operate at a higher temperature.

5 Claims, 9 Drawing Figures

THERMAL INTERFACE ADAPTER FOR A CONDUCTION COOLING MODULE

BACKGROUND OF THE INVENTION

1. Statement of the Invention

The invention relates to a thermal interface adapter for increasing the thermal resistance of a conduction cooling module, and more particularly, to a thermal interface adapter which can be customized for a particular module so as to keep the electronic elements being cooled within specified limits.

2. Description of the Prior Art

With the miniaturized capabilities afforded by the discovery of solid state electronics, various improved means of dissipating the heat generated by solid state components have been investigated. The standard forced air convection means appears to have reached its limit of practicality in that the amount of air that is required to provide sufficient cooling for the limited heat dissipating surfaces introduces a noise problem, and without some auxiliary techniques cannot maintain each of a large number of components within its critical, narrow operating temperature range. Accordingly, especially in connection with large scale computer systems, an encapsulated cooling system has been devised which provides one or more heat dissipating electronic components encapsulated in a special cooling environment such as a low boiling point liquid or a gas. U.S. Pat. No. 3,993,123, filed Oct. 28, 1975 and issued Nov. 23, 1976 shows an example of an encapsulated cooling unit for one or more heat generating components mounted on a substrate. A heat conductive cap is sealed to the substrate enclosing the heat generating components. The wall of the cap opposite the substrate contains elongated openings therein extending towards the heat generating components and on the same centers with respect thereto. A resilient member is located in the cap in communion with the inner end of the openings. A thermal conductive element is located in each of the openings forming a small peripheral gap between each opening wall and the associated thermal conductive element. The resilient member urges the thermal conductive elements into pressure contact with the heat generating components. A thermal conductive inert gas is located within the cap filling the peripheral gaps and the interfaces between the heat generating elements and the thermal conductive elements. The heat is removed from the cap by external heat removal means.

This conduction cooling scheme is very efficient and keeps the electronic components to be cooled operating within their specified thermal limits. However, when low-powered chips are included with high-powered chips within the same module or all low-powered chips are utilized, the direct conduction cooling module is too efficient for the low-power electronic components. That is, the low-power electronic components are essentially over-cooled such that they are maintained below their minimum operating temperature limit.

SUMMARY OF THE INVENTION

A conduction cooling module is provided of the type having a conduction heat transfer path for removing heat from electronic components wherein the electronic components consist of a mixture of low and high-power components to be cooled or in some cases all low-power electronic components. A thermal interface adapter is located within the module between the housing and the heat sink thereby creating an interface between the housing and the adapter, and the adapter and the heat sink. The thermal interface adapter and the interfaces associated therewith have a predetermined thermal resistance thereby increasing the heat transfer path thermal resistance to allow the low-power electronic components within the module to operate at a higher temperature.

The thermal interface adapter also includes cut-out portions therein which cause localized increases in thermal resistance as a function of the amount of cut-out.

It is the main object of the present invention to provide a thermal interface adapter for use in a conduction cooling module whereby the low-power electronic components are maintained at an operating temperature above their minimum thermal operating limit.

It is another object of the present invention to provide a thermal interface adapter having cut-out portions therein for use in a conduction cooling module whereby a higher thermal resistance is provided locally for low powered electronic components.

The foregoing and other objects, features and advantages of the invention will be apparent from the following more particular description of preferred embodiments of the invention as illustrated in the accompanying drawings.

DESCRIPTION OF THE PREFERRED EMBODIMENTS

Figure 1:
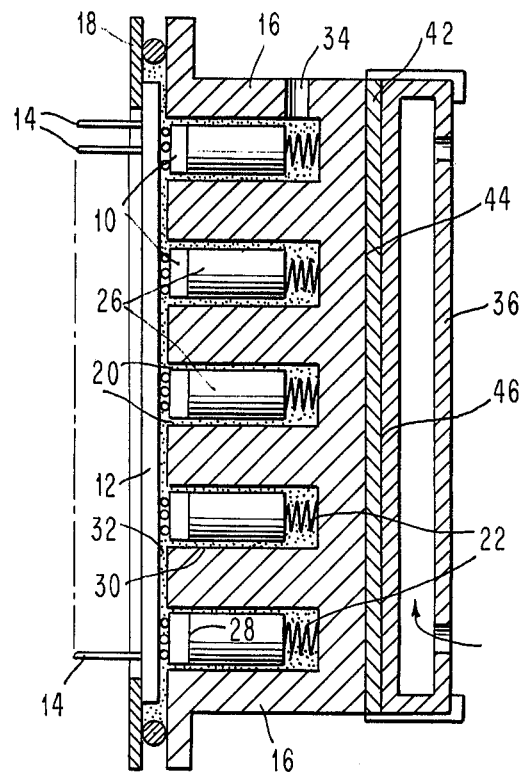
FIG. 1 is a partially schematic cross-sectional view of a thermal cooling module which includes a thermal interface adapter.

Referring to FIG. 1, there is shown a cross-sectional view of a gas encapsulated module for providing cooling of electronic components shown in the form of chips 10 to be cooled. As is well known, the chip 10 consists of solid state circuits and devices which are densely packed on each chip. The power consumed in the circuits within the chip generates heat which must be removed from the chip. Since the various circuits have different power requirements, and since the integrated components thereon must be maintained within certain temperature ranges for reliable operation, the cooling must be of such character as to maintain the chip temperature within the required operating range.

The chips 10 are mounted on one side of a substrate 12, generally made of ceramic, which has pins 14 extending from the other side thereof. These connecting pins 14 provide for the plugging of a module into a board (not shown) which may very well carry auxiliary circuits, etc. A container or cap 16 is attached to the substrate 12 by means of a flange 18 which extends from the periphery of the substrate 12 to the cap 16. The cap 16 is made of a good heat conductive material such as copper or aluminum. The cap 16 is sufficiently thick to provide openings opposite each of the closely spaced chips 10. Springs 22 are located at the inner end of each of the openings 20 and provide a spring force against a piston element 26 located in the opening 20. The spring force gives the piston element 26 a predetermined force at the outer end thereof where it contacts the back surface of the electronic chip 10 to be cooled. A small annular gap 30 exists between the circumference of the piston element 26 and the sidewalls of the hole 20 in the cap 16. The gap 30 is sufficiently wide to allow a little play of the element 26 within the hole 20 so that the element 26 can attain relatively flat surface engagement with the chip 10. It should also be appreciated that the thermal conductive piston element 26 is adaptable to chips 10 of various heights because of the resiliency of the spring member 22. Helium gas 32 is introduced into the open space between the substrate 12 and the cap 16. Helium gas is utilized for several reasons. The gas has a low molecular weight and thus easily fills the voids in the interface 28 between the thermal conductive piston elements 26 and the chips 10. Likewise, the helium gas 32 fills the gap 30 between the periphery of the thermal conductive piston element 26 and the wall of the hole 20 thus forming a gaseous thermal conductive interface. Another feature of the gas is that it is a good thermal conductor and, therefore, forms an interface having high heat conductivity. That is, the interfaces formed using helium gas have a relatively low thermal resistance. Another feature of the gas which is very important is that it is inert. By inert it is meant that the gas is electrically non-conductive, non-poisonous, non-corrosive, non-flamable, non-explosive and non-toxic. The gas also has a high adhesion quality that essentially wets the surface which it is in contact with. Other low-molecular weight gases such as hydrogen or carbon dioxide could be used. Thus, the pressure interface 28 containing a thermal conductive inert gas in the voids provides a low-resistance to the heat transfer and, accordingly, provides a high heat conductive interface. The gap 30 around the periphery of the thermal conductive elements 26 containing the helium gases previously mentioned also provides a good thermal interface. Thus, the module must be designed to obtain the required heat transfer rate to maintain the chip 10 within its required operating range. The heat accummulated in the thermal conductive material cap 16 from each of the thermal conductive elements 26 is transferred to a cold plate 38 which is attached to the cap 16. As can be seen from FIG. 1, the cap 16's surface is relatively flat so that the cold plate 36 can be attached thereto in good thermal conductive relation. The cold plate 36 has a cooling liquid circulated therethrough which removes the heat transferred to the cold plate.

Figure 2:
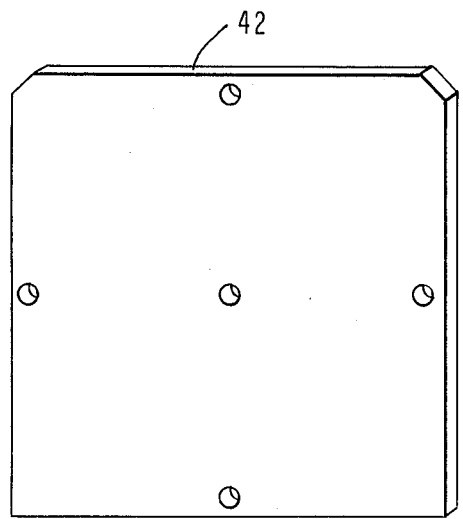
FIG. 2 is a plan view of a thermal interface adapter having 100% contact area.

The module is not limited to the cold plate 36 type of exterior heat removal, and in fact could employ an air cooled heat sink as well. Thus, the heat transfer path for removing heat from the heat generating electronic component chips 10 across the interface 28 between the chips 10 and the piston conductive elements 26, through the piston conductive elements 26 and across the interface 30 between the circumference of these elements and the walls of the openings 20 within the cap 16. The heat is then conveyed through the cap 16 and through the interface between the top of the cap 16 and the wall of the cold plate 6. The heat moves through the wall of the cold plate 36 into the liquid which flows through the cold plate 36 which is the ultimate heat sink. As can be seen, the rate of heat removal must be such as to keep the electronic components or chips 10 within their thermal operating range. It has been found that low-power chips, that is, those chips which do not generate sufficient heat are subject to the good thermal heat transfer path and, consequently, are maintained below their specified minimum operating temperature limit. This problem is solved by the present invention by including a thermal adapter plate 42 between the top of the cap 16 and the cold plate 36. The introduction of this thermal adapter 42 provides an additional interface 44 in the thermal path having a resistance plus the thermal resistance of the thermal adapter 42 itself. The introduction of the adapter 42 provides the interface 44 between the top of the cap 16 and the adapter 42 and a further interface 46 between the top of the adapter 42 and the cold plate 36. The adapter selected is made of polycarbonate which provides the desired thermal resistance as well as providing the desired interface resistance when the adapter 42 is attached to the cap or housing 16. Of course, the thermal interface adapter can be made of a number of different materials such as teflon, mica, stainless steel, aluminum, etc. The thermal interface adapter 42 having 100% contact area, that is, there are no cut-outs in the adapter is shown in FIG. 2. This adapter is utilized in a module where all of the chips 10 to be cooled are low-power chips whose operating temperature must be kept above the minimum operating temperature. A thin sheet of polycarbonate material was bolted to the casing or housing 16 of the module with sufficient force to give the desired thermal resistance of the gap 44 between the housing 16 and the interface adapter 42. Polycarbonate was selected since it is sufficiently hard and can withstand the compression forces applied when screwing or bolting to the housing 16. Polycarbonate also has the required thermal resistance characteristics desired. The increase in the thermal resistance due to the insertion of the interface adapter 42 is sufficient to cause the junction temperature between the chip 10 and the heat transfer path to be sufficiently high that the chip can be brought up to operating temperature within the predetermined operating limits and be maintained there.

Figure 3:
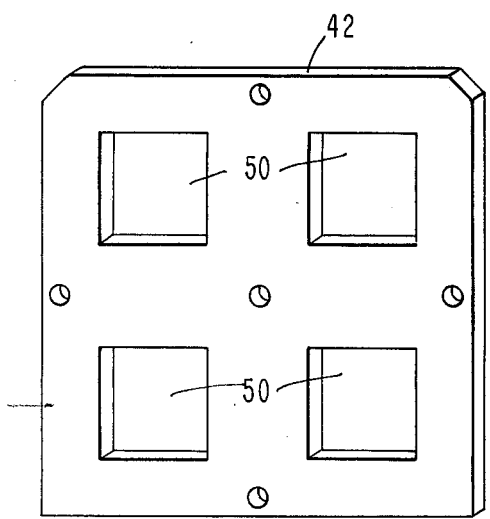
FIG. 3 is a plan view of a thermal interface adapter having symmetrical cut-out areas and including 75% contact area.

FIG. 3 shows a further thermal interface adapter 42 for use in a cooling module to maintain the chip 10 to be cooled above a minimum operating temperature. This adapter has approximately 75% contact area only since certain portions thereof are cut-out. The cut-out portions 50 are in the forms of predetermined sized squares which are arranged symmetrically about the center of the adapter 42. These cut-out portions 50 or squares provide an extremely high thermal resistance and, accordingly, require the heat to pass through the contact areas. These cut-out portions 50 in the thermal interface adapter 42 increase the thermal resistance from the housing 16 to the cold plate 36 and, consequently, cause a considerable increase in the junction temperature which tends to maintain the chips 10 to be cooled well above the minimum operating temperature.

Figure 4:
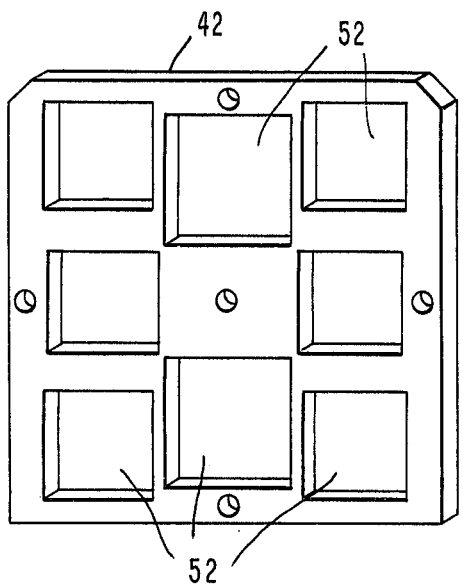
FIG. 4 is a plan view of a thermal interface adapter having square cut-out areas and maintaining 50% contact area.

FIG. 4 shows a thermal interface adapter 42 having only 50% contact area with the cut-out portions 52 being square and being located somewhat symmetrically about the center of the adapter. As mentioned previously, the additional cut-outs cause a further increase in thermal resistance in the thermal cooling path, thus, causing the chips 10 to be cooled to operate well above their minimum operating temperature. It should be appreciated that there are considerable shapes and arrangements of the cut-outs with the adapter 42 which can be devised. The thermal resistance obtained with a particular design can, of course, be theoretically determined, however, it is much more practical to test a particular design in the module to determine its effects on the chip operating temperature.

Figure 5:
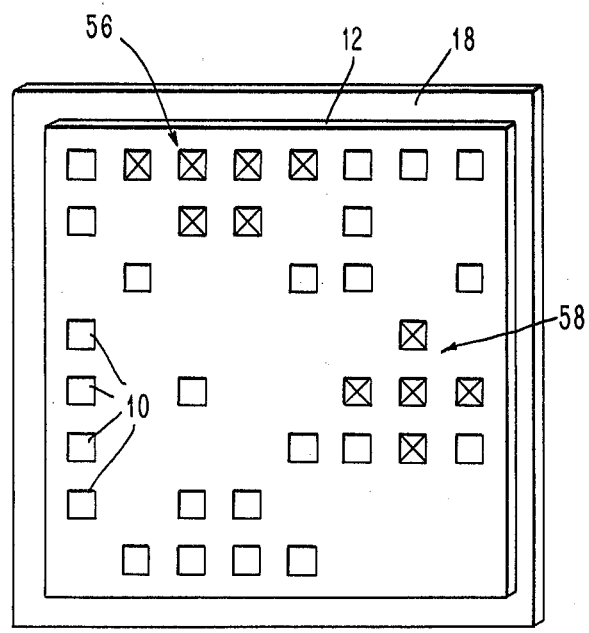
FIG. 5 is a schematic representation showing a plan view of the substrate and flange with the low-powered chips to be cooled grouped thereon.

A combination of low-power and high-power chips 10 to be cooled within the same module are shown in FIG. 5. The low-power chips are designated with an X drawn therethrough and the high-power chips just by squares. It can be seen that the low-power chips are arranged in groups 56, and 58 on the substrate 12. A higher resistance heat path in the module adjacent to the low-power chip groupings is accomplished by including a thermal interface adapter which has cut-out portions 60 and 62 therein of the same shape and location as the low-power chip groupings 56 and 58 on the substrate 12. As can be seen from FIG. 6, these cut-outs 60, 62 will be in the direct thermal path associated with the low-power chip groupings 56, 58 and, accordingly, will introduce a higher thermal resistance in the path which will cause the low-power chips to operate at a higher temperature so as to be above the minimum operating temperature thereof.

Figure 6:
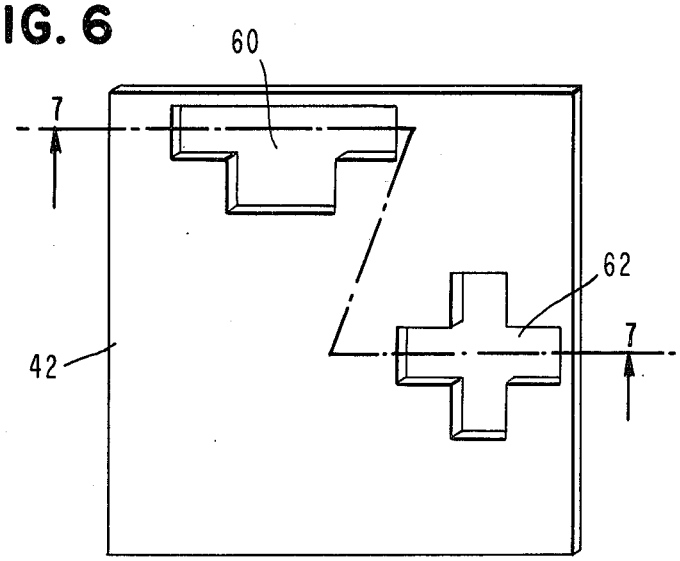
FIG. 6 is a plan view of a thermal interface adapter having cut-outs for temperature control of low-power chips grouped as in FIG. 5.
Figure 7:
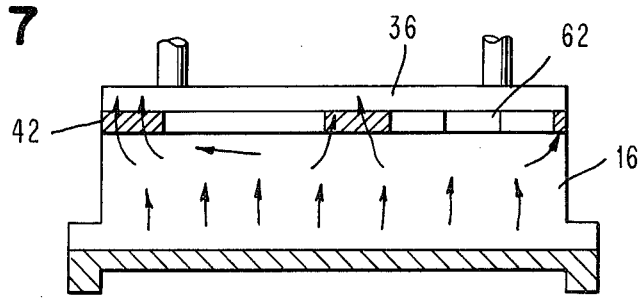
FIG. 7 is a schematic representation showing the cross-sectional view taken along the line 7—7 of FIG. 6 and showing the heat transfer path across the interface adapter within the module.

FIG. 7 shows a cross-sectional view taken across the thermal interface adapter 42 along the line 7—7 of FIG. 6 thus including the cut-out portions shown therein. The adapter is shown within the module and the heat transfer is represented by arrows. As can be seen, the heat does not pass through the cut-out portions but spreads out through the housing to the contact areas of the thermal interface adapter to pass to the cold plate. The thermal resistance of the heat transfer path is increased by the introduction of the cutout areas and, accordingly, the low-power chips adjacent the cut-out portions operate at a higher temperature due to the higher resistance path which must be followed because of the cut-out portions in the thermal interface adapter within the heat transfer path.

Figure 8:
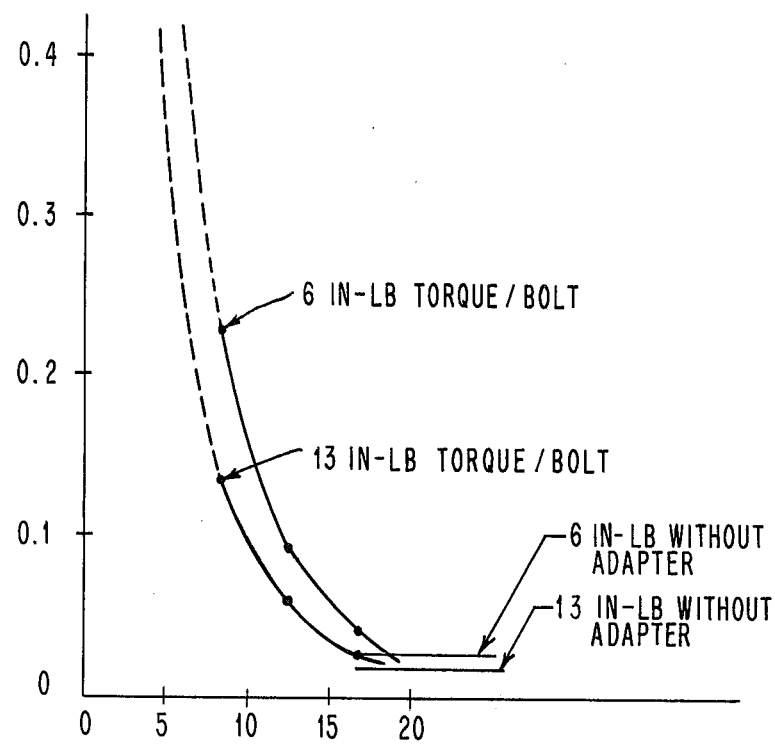
FIG. 8 is a plot of the thermal interface resistance vs. the contact area of a thermal interface adapter in a module.

The effect of thermal interface adapters on interface resistance is shown in FIG. 8 where the thermal interface resistance in degrees centigrade per watt versus contact area in square inches is plotted. The two curves shown represent two different torques applied to the bolts holding the thermal interface adapter to the module housing. One curve is identified as a 13" pound torque per bolt while the other is identified as 6" pound torque per bolt. It can be seen from the curves in FIG. 8 that the thermal interface resistance increases sharply as the contact area decreases. The 100% contact area of the thermal interface adapter is 17.2 square inches.

Figure 9:
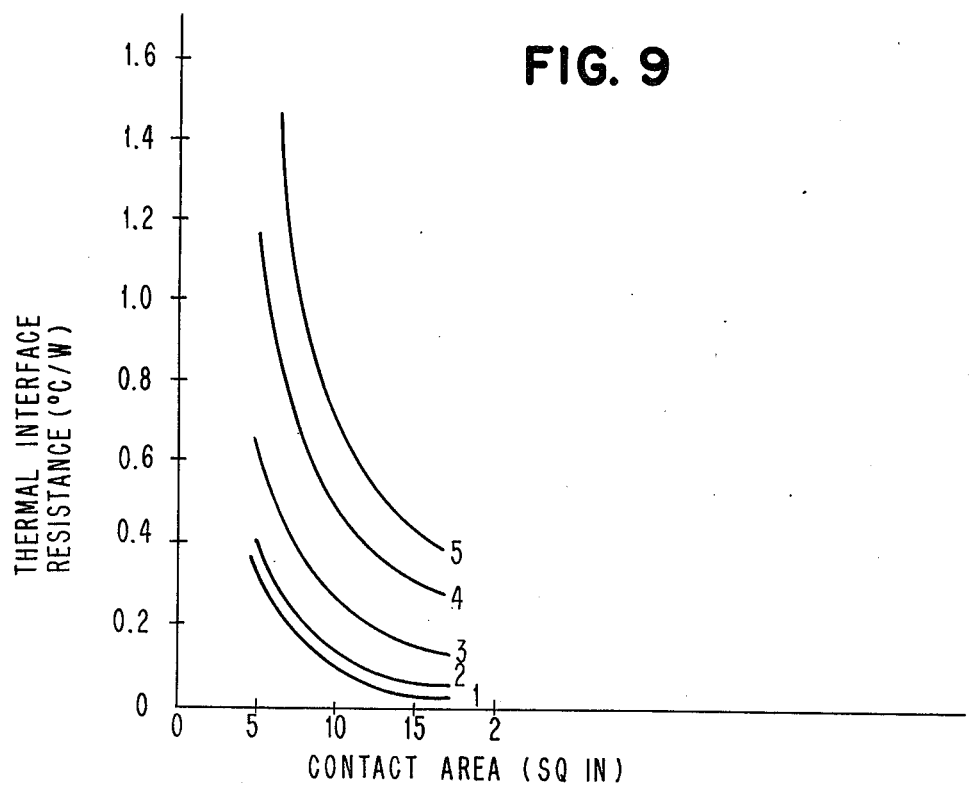
FIG. 9. is a plot of the thermal interface resistance vs. the contact area for different thermal interface adapter materials.

FIG. 9 shows the effect of material on thermal interface adapter performance. The graph shows the thermal interface resistance in degree centigrade per watt vs. the contact area in square inches. The curves in descending order represent polycarbonate, teflon, mica, stainless steel and aluminum. From the curves it can be seen that polycarbonate gives the best overall thermal interface resistance. A polycarbonate adapter, 0.03" thick with 14 square inches of contact area provides an interface resistance of 0.5° c/w. A teflon adapter, 0.03" thick with 10.5 square inches of contact area provides an interface resistance of 0.5° c/w or a mica adapter, 0.03" thick with 6.5 square inches of contact area provides an interface resistance of 0.5° c/w.

While the invention has been particularly shown and described with reference to the preferred embodiments thereof, it will be understood by those skilled in the art that the various changes in form and detail may be made therein without departing from the spirit and scope of the invention.

What is claimed is:

1. In a conduction cooling module of the type having a conduction heat transfer path for removing heat from electronic components comprising:
   a plurality of electronic components to be cooled within said module at least one of which is low-power electronic component and at least one of which is a high-power electronic component;
   a housing member included in the heat transfer path;
   a heat sink adapted for connection to said housing for removing the heat therefrom;
   a thermal interface adapter located in the interface between said housing and said heat sink;
   said thermal interface adapter having a predetermined thermal resistance and having cut-out portions therein opposite said low power electronic components thereby causing local increases in thermal resistance as a function of the amount of cut-out thereby causing said low-power electronic components within the module to operate at a higher temperature.

2. In a conduction cooling module according to claim 1, wherein said low-power electronic components are arranged in one or more groups within the module and said thermal interface adapter cutout sections each corresponds in shape and size to a corresponding group and is located adjacent thereto in the heat transfer path associated with the respective group.

3. In a conduction cooling module according to claim 1, wherein said thermal interface adapter is made of polycarbonate of sufficient thickness and having enough contact area with said housing and heat sink to keep the thermal resistance within a predetermined range thereby maintaining the electronic components to be cooled within thermal operating limits.

4. In a conduction cooling module according to claim 1, wherein said thermal interface adapter is made of teflon.

5. In a conduction cooling module according to claim 1, wherein said thermal interface adapter is made of mica.

* * * * *